(12) United States Patent
Chan et al.

(10) Patent No.: US 7,453,307 B2
(45) Date of Patent: Nov. 18, 2008

(54) PROCESS INDEPENDENT VOLTAGE CONTROLLED LOGARITHMIC ATTENUATOR HAVING A LOW DISTORTION AND METHOD THEREFOR

(75) Inventors: Wilson Wai-Sum Chan, Kowloon (CN); Hau-Yiu Tsui, Kowloon (CN); Ka-Wai Ho, Shatin (CN); Isacc Terasuth Ko, Kowloon (CN)

(73) Assignee: Supertex, Inc., Sunnyvale, CA (US)

( * ) Notice: Subject to any disclaimer, the term of this patent is extended or adjusted under 35 U.S.C. 154(b) by 216 days.

(21) Appl. No.: 11/064,154

(22) Filed: Feb. 23, 2005

(65) Prior Publication Data

US 2006/0186944 A1 Aug. 24, 2006

(51) Int. Cl.
*H03L 5/00* (2006.01)

(52) U.S. Cl. .................................. 327/308; 333/81 R

(58) Field of Classification Search ................. 327/308; 333/81 R

See application file for complete search history.

(56) References Cited

U.S. PATENT DOCUMENTS

| 5,339,272 A * | 8/1994 | Tedrow et al. .......... 365/189.09 |
| 5,880,618 A * | 3/1999 | Koen ........................... 327/351 |
| 6,906,588 B2 * | 6/2005 | Mouret et al. ................ 330/254 |

* cited by examiner

*Primary Examiner*—Kenneth B. Wells
(74) *Attorney, Agent, or Firm*—Jeffrey D. Moy; Weiss & Moy, P.C.

(57) ABSTRACT

A process independent voltage controlled logarithmic attenuator has an attenuator control stage block having a first input coupled to a controlled input and a second input coupled to an offset generator. An attenuator transistor is coupled to the attenuator controlled stage block. An output of the attenuator controlled stage block is both slope and maximum voltage definable for a process independent design.

7 Claims, 7 Drawing Sheets

PROCESS INDEPENDENT VOLTAGE CONTROLLED LOGARITHMIC ATTENUATOR HAVING A LOW DISTORTION AND METHOD THEREFOR

FIELD OF THE INVENTION

The present invention relates generally to a variable gain amplifier (VGA), and more specifically to a process independent voltage controlled logarithmic attenuator having a low distortion for a VGA.

BACKGROUND OF THE INVENTION

Many applications such as medical imaging and cellular radios need to manage signal amplitudes. Many applications require both analog and digital signal processing to provide the best combination of cost and performance. In such cases, a VGA (variable-gain amplifier) allows a product to adapt to changeable operating environments and excessive signal dynamics.

A wideband VGA can be implemented by following a voltage-controlled-attenuator block by a gain cell. The attenuator is constructed in MOS with an offset cascade of amplifiers driving the gates of attenuator FET transistors. The magnitude of the VCA input signal (from the signal source or preamplifier) is reduced by a programmable attenuation factor, set by the analog VCA control voltage.

FIG. 1 illustrates this adjustable characteristic. The analog variable gain characteristic is linear in dB as a function of the control voltage, and is created as a piecewise approximation of an ideal dB-linear transfer function. Internally, the signal is attenuated by having the analog control voltage vary the channel resistance of a set of shunt-connected FET transistors.

Referring to FIG. 2, a prior art variable gain amplifier (VGA) is shown. The analog VCA control voltage gain setting is accomplished by multiple FET shunt elements. The attenuator control stage including differential amplifiers A1-AK and the offset generator produces K output voltages V1-VK in which the i-th output is equal to VCM+VT when control input is equal to Vi, and varies as a function of the threshold voltage VT of the N-channel MOSFET of the integrated circuit on which the logarithmic attenuator is formed. This type of VCA has been used in some variable-gain amplifier chips. However, the attenuation can be quite process-dependent and unstable.

Thus, an improved apparatus and method that overcomes the above problems is desire. The improved apparatus and method must be able to match the on-resistance of Q1-K to resistors R1-K and RS to provide a high-performance VGA circuit.

SUMMARY OF THE INVENTION

In accordance with one embodiment of the present invention, a process independent voltage controlled logarithmic attenuator is disclosed. The process independent voltage controlled logarithmic attenuator has an attenuator controlled stage block having a first input coupled to a controlled input and a second input coupled to an offset generator. An attenuator transistor is coupled to the attenuator controlled stage block. An output of the attenuator controlled stage block is both slope and maximum voltage definable.

In accordance with another embodiment of the present invention, a process independent voltage controlled logarithmic attenuator is disclosed. The attenuator has a maximum gate voltage generator. An amplifier has a first input coupled to a controlled input and a second input coupled to an offset generator. A positive supply of the amplifier is coupled to the maximum gate voltage generator. A maximum output of the amplifier being approximately equal to a voltage of the maximum gate voltage generator. An attenuator transistor is coupled to a voltage supply and to an output of the amplifier. A resistive element is coupled the attenuator transistor and to an attenuator output terminal. An input resistive element is coupled to an attenuator input and to the resistive element.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

FIG. 2b shows different diagrams depicting different characteristics of different elements of the VGA circuit depicted in FIG. 2a.

DESCRIPTION OF PREFFERED EMBODIMENT

Figure 2A:
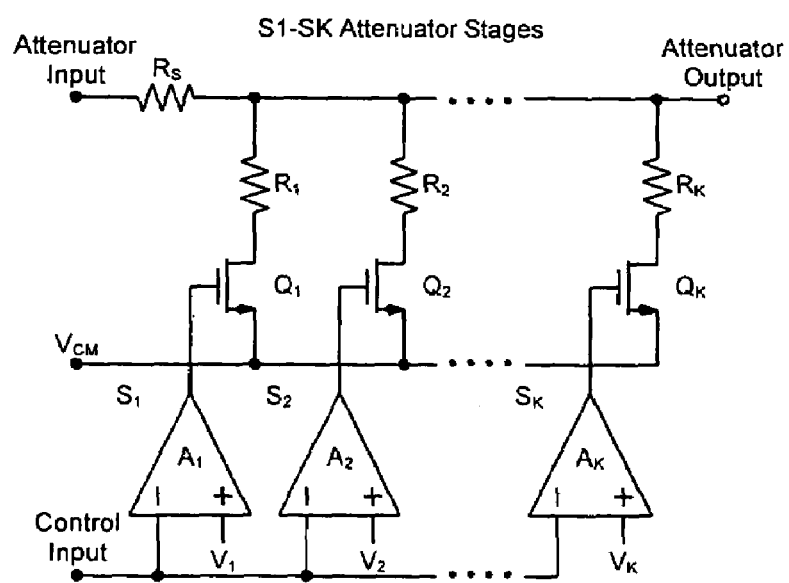
FIG. 2a is a simplified diagram of a prior art Variable Gain Amplifier (VGA) circuit.
Figure 2B:
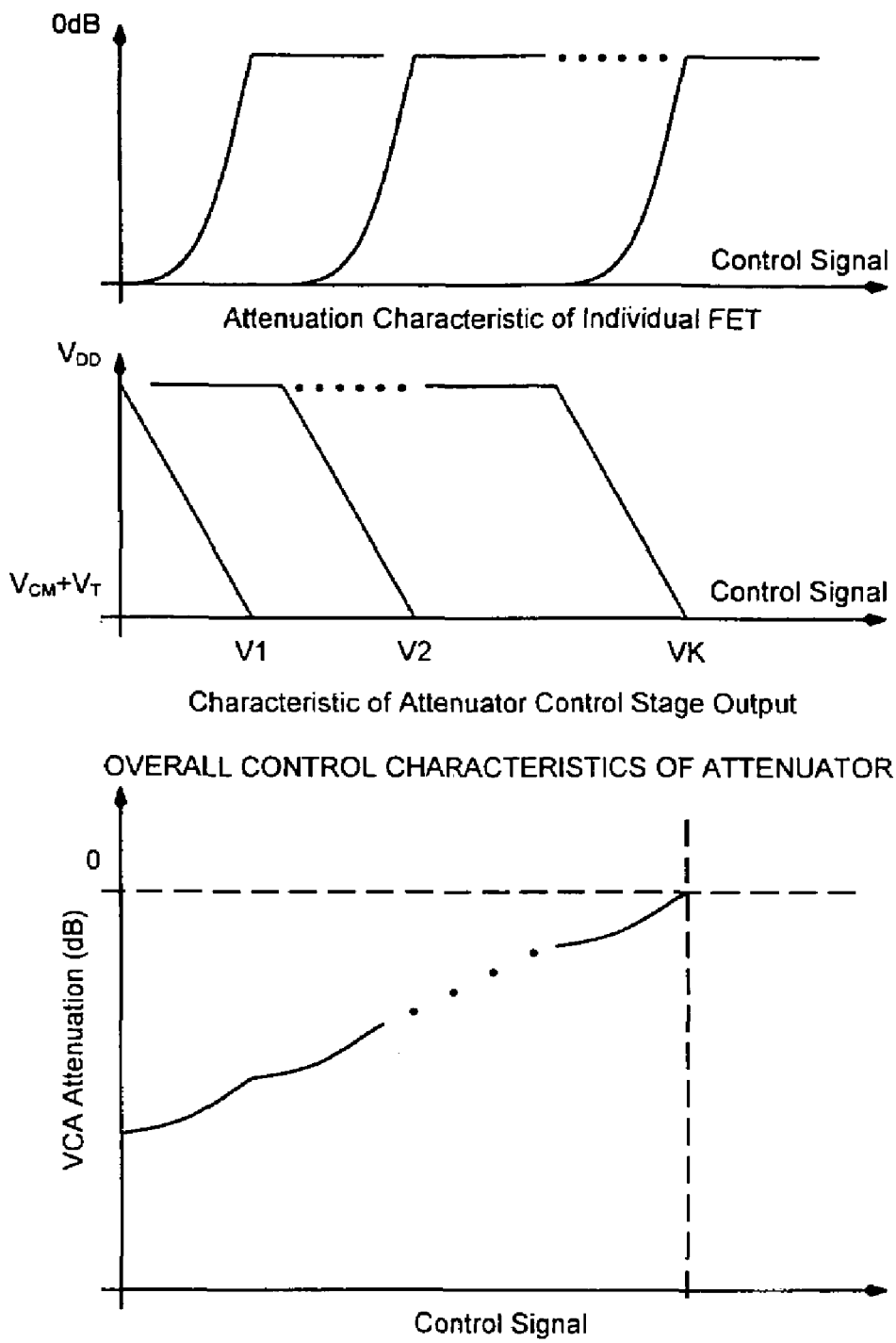

Referring to FIG. 2a-2b, a prior art variable gain amplifier (VGA) and it's characteristics are shown. The analog VCA control voltage gain setting is accomplished by multiple FET shunt elements. The attenuator control stage including differential amplifiers A1-AK and the offset generator produces K output voltages V1-VK in which the i-th output is equal to VCM+VT when control input is equal to Vi, and varies as a function of the threshold voltage VT of the N-channel MOSFET of the integrated circuit on which the logarithmic attenuator is formed. This type of VCA has been used in some variable-gain amplifier chips. However, the attenuation can be quite process-dependent and unstable.

The attenuation characteristic of individual FETs in the position Q1-K is controlled by the attenuator control stage output for the overall control characteristics of the attenuator. Typically, one must define both the slope and maximum voltage of the attenuator control stage output for a process-independent design.

Figure 3:
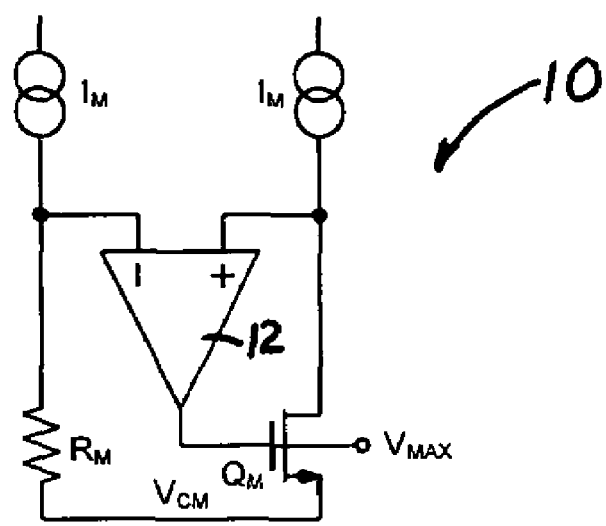
FIG. 3 is a simplified diagram of a maximum gate voltage generator used in the present invention.

Referring now to FIG. 3, a maximum gate voltage generator 10 is shown. The maximum gate voltage generator 10 uses a FET QM, a resistor RM and a differential amplifier 12. The differential amplifier 12 in the feedback loop controls the gate-voltage and matches the on-resistance of QM to the resistor RM.

Figure 1:
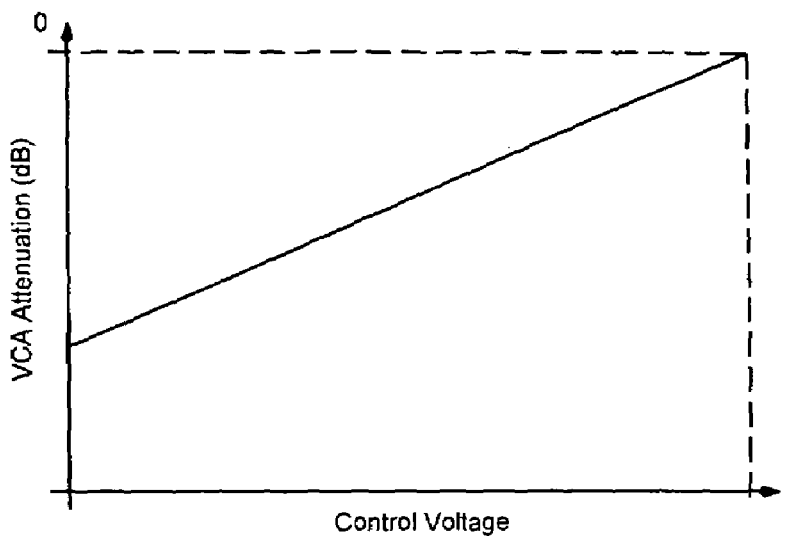
FIG. 1 is a diagram depicting the characteristics of a swept attenuator.
Figure 4:
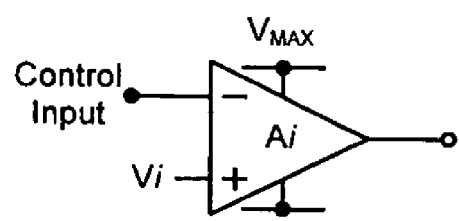
FIG. 4 is a simplified diagram of an offset-cascaded amplifier.

The offset-cascaded amplifiers A1-AK in FIG. 1 may use the maximum gate voltage VMAX as the positive supply as shown in FIG. 4.

Figure 5:
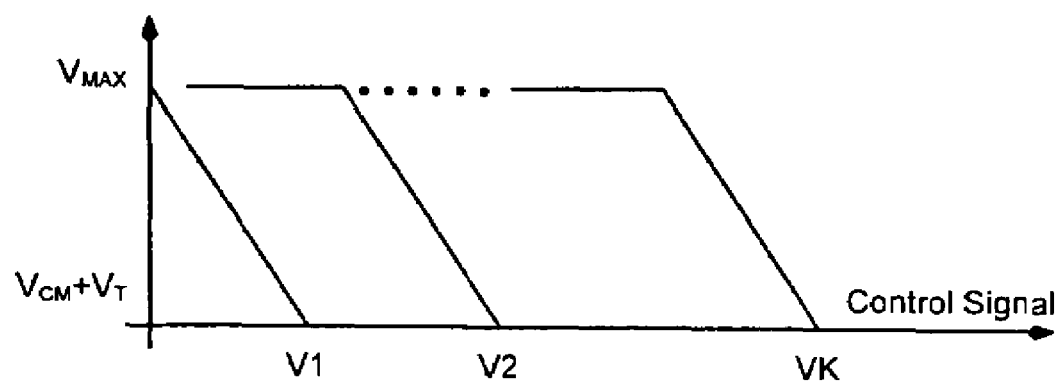
FIG. 5 depicts ideal transfer function from control signal to gate voltages.

Ideal transfer function from control signal to gate voltages is the characteristic of attenuator control stage output shown in FIG. 5. In the ideal transfer function, the maximum voltage of the attenuator control stage outputs is VMAX and, hence, the minimum on-resistance of the FET Q1-K is expected to be proportional to the resistor RM. If the structure of resistor RM is the same as the resistors R1-K and RS, the VCA is process, temperature and supply independent.

Figure 6:
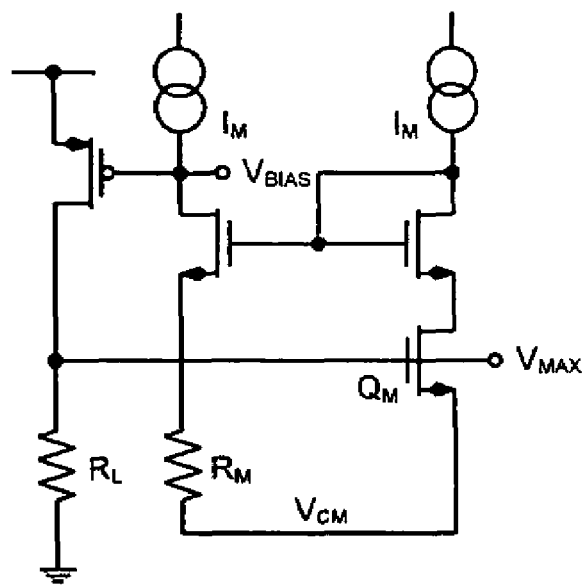
FIG. 6 is a simplified diagram of a differential amplifier for maximum gate voltage generator.

Referring now to FIG. 6, a circuit diagram of the maximum gate voltage generator using a common-gate amplifier is shown. If the actual realization is of the form shown in FIG. 7, generating both the maximum gate voltage VMAX and the current bias VBIAS for VMAX across RL, then we can use VBIAS instead of VMAX for setting maximum output voltages of the offset-cascaded amplifiers A1-AK as the next section.

Figure 7:
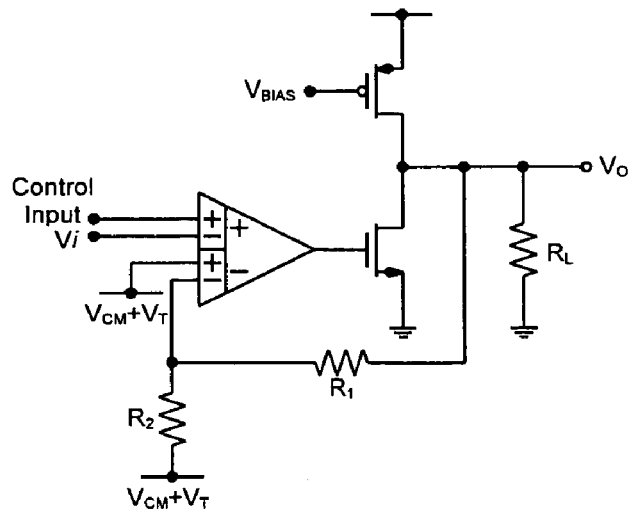
FIG. 7 is a simplified diagram of a offset-cascaded amplifier.

A simple offset-cascaded amplifier is shown in FIG. 7 which has an output limited to VMAX.

Figure 8:
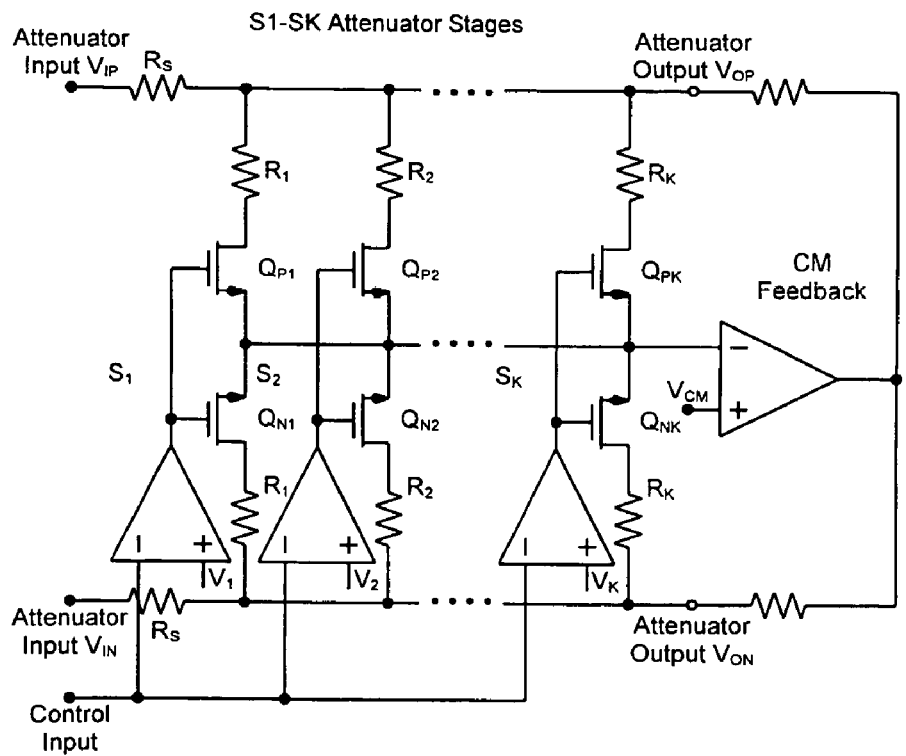
FIG. 8 is a simplified diagram of a VCA with shunt common mode feedback of the present invention.
Figure 8:
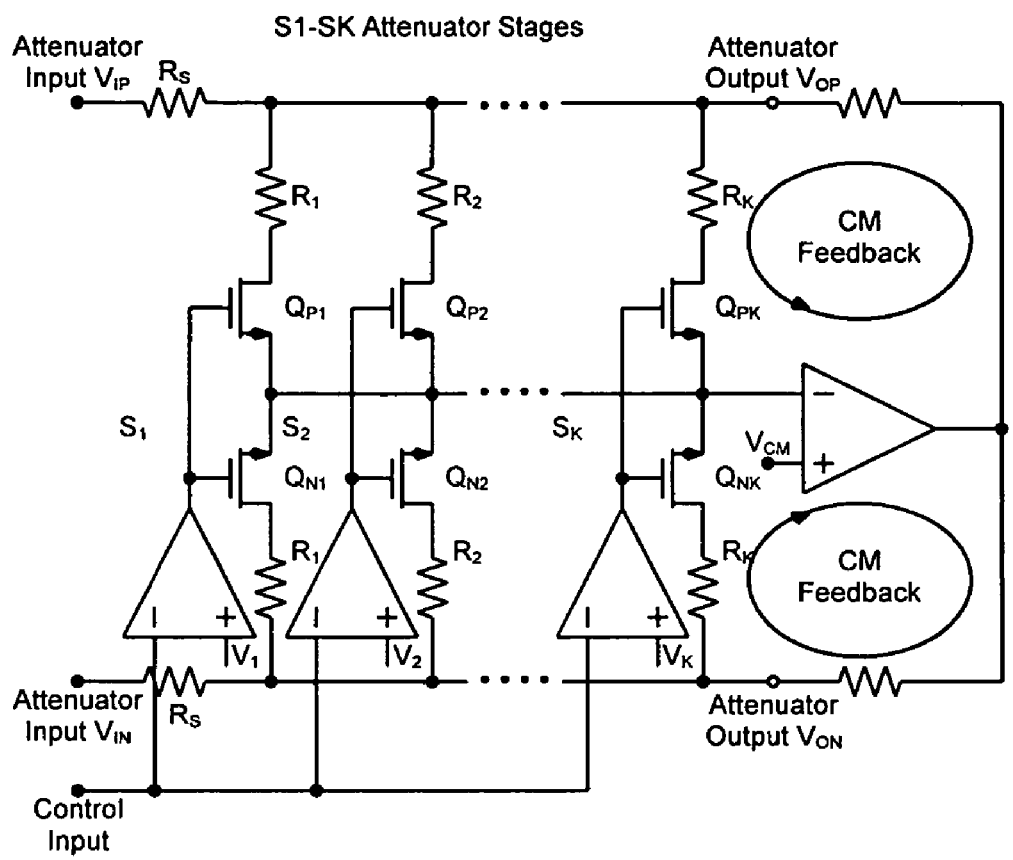

While the conventional differential VCA is intended for superb second and third order distortion performance and low crosstalk, it is not the case when common-mode signal exists at the attenuator inputs. The problem can be solved using a VCA with a shunt common-mode feedback 20 as shown in FIG. 8. The attenuator output common-mode becomes virtual ground to common-mode currents so that negligible common-mode voltage appears across the attenuator outputs.

Because no CM voltage appears at the output, all the FET QP1-K and QN1-K are working at fully symmetrical manner and their non-linearity will not produce second harmonics to the VCA.

Figure 9:
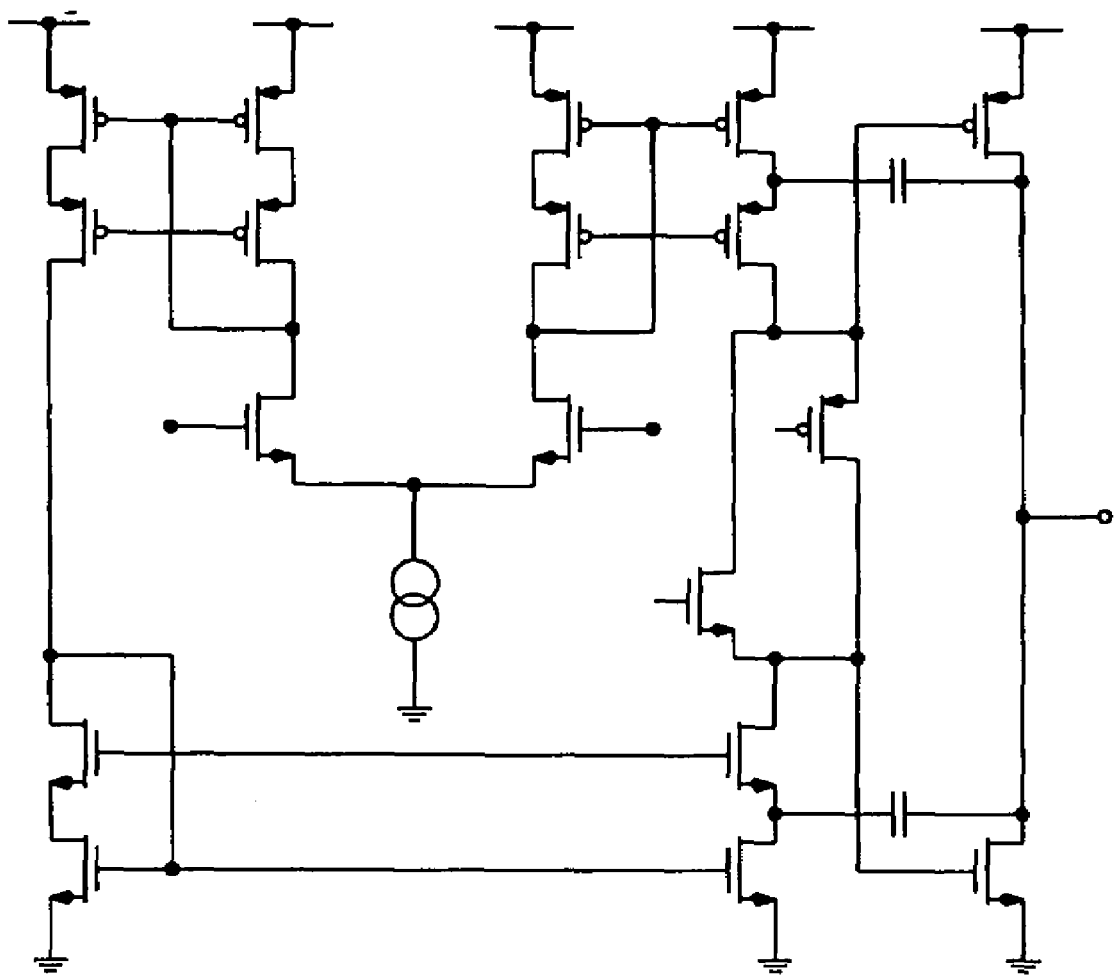
FIG. 9 is a symmetrical OTA with output buffer (Error amplifier for CM feedback).

FIG. 9 shows a symmetrical OTA, with output buffer based on floating current sources. This configuration is very useful in high-speed error amplifier design for the shunt common-mode feedback in FIG. 8.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process independent voltage controlled logarithmic attenuator comprising:
    a maximum gate voltage generator;
    an amplifier having a first input coupled to a controlled input and a second input coupled to an offset generator, wherein a positive power supply of the amplifier is coupled to the maximum gate voltage generator, a maximum output of the amplifier being approximately equal to a voltage of the maximum gate voltage generator;
    an attenuator transistor coupled to the maximum gate voltage generator and to an output of the amplifier;
    a resistive element coupled the attenuator transistor and to an attenuator output terminal; and
    an input resistive element coupled to an attenuator input and to the resistive element;
    wherein a minimum on-resistance of the attenuator transistor is proportional to a maximum gate voltage generator resistive element, the maximum gate voltage generator resistive element having a same structure of the resistive element coupled the attenuator transistor so the logarithmic attenuator is process, temperature and supply independent.

2. A process independent voltage controlled logarithmic attenuator in accordance with claim 1 wherein the maximum gate voltage generator comprises:
    a maximum gate voltage generator amplifier;
    a feedback transistor coupled to a first input of the maximum gate voltage generator amplifier and to an output of the maximum gate voltage generator amplifier; and
    the maximum gate voltage generator resistive element coupled to the feedback transistor and to the maximum gate voltage generator amplifier.

3. A process independent voltage controlled variable gain amplifier comprising:
    an input resistive element coupled to a VCA input;
    a maximum gate voltage generator; and
    a plurality of attenuator stages wherein each attenuator stage comprises:
        an amplifier coupled to a controlled input and to an offset generator, wherein a positive supply of the amplifier is coupled to the maximum gate voltage generator;
        an attenuator transistor coupled to a voltage supply and to an output of the amplifier; and
        a resistive element coupled to the attenuator transistor and to an attenuator output terminal;
    wherein a minimum on-resistance of the attenuator transistor is proportional to a maximum gate voltage generator resistive element, the maximum gate voltage generator resistive element having a same structure of the resistive element coupled the attenuator transistor so the logarithmic attenuator is process, temperature and supply independent.

4. A process independent voltage controlled variable gain amplifier in accordance with claim 3 wherein the maximum gate voltage generator comprises;
    a maximum gate voltage generator amplifier;
    a feedback transistor coupled to a first input of the maximum gate voltage generator amplifier and to an output of the maximum gate voltage generator amplifier; and
    the maximum gate voltage generator resistive element coupled to the feedback transistor and to a second input of the maximum gate voltage generator.

5. A process independent voltage controlled logarithmic attenuator in accordance with claim 4 wherein the maximum gate voltage generator amplifier controls a gate voltage of the feedback transistor and matches an ON-resistance of the feedback transistor to the maximum gate voltage generator resistive element.

6. A voltage controlled attenuator having negligible common mode voltage across outputs of the attenuator comprising:
    a first attenuator input;
    a second attenuator input;
    a first Input resistive element coupled to the first attenuator input;
    a second input resistive element coupled to the second attenuator input;
    a first output resistive element coupled to the first input resistive element;
    a second output resistive element coupled to the second input resistive element;
    at least one attenuator stage wherein each attenuator stage comprises:

an amplifier having a first amplifier input coupled to a controlled input and a second amplifier input coupled to an offset generator;

a first attenuator resistive element coupled to a the second input resistive element;

a first transistor coupled to the first attenuator resistive element and to an output of the amplifier; pg,15 a second transistor coupled to the first transistor and the output of the amplifier; and a second attenuator resistive element coupled to the second transistor and the first input resistive element; and a feedback amplifier having a first input coupled to the first and second transistor, a second input coupled to an voltage supply, and an output coupled to the first and second output resistive elements, wherein the output becomes virtual ground to common-node currents to prevent a common-node voltage across the output.

7. A voltage controlled attenuator having negligible common mode voltage across outputs of the attenuator in accordance with Claim 6 further comprising a plurality of attenuator stages.

* * * * *